United States Patent
Mayder (10) Patent No.: US 8,305,098 B2
(45) Date of Patent: Nov. 6, 2012

(54) ELEMENT USABLE WITH THE METHOD, AND A STANDALONE PROBE CARD TESTER FORMABLE USING THE METHOD

(75) Inventor: Romi O. Mayder, San Jose, CA (US)

(73) Assignee: Advantest (Singapore) Pte Ltd, Singapore (SG)

(*) Notice: Subject to any disclaimer, the term of this patent is extended or adjusted under 35 U.S.C. 154(b) by 30 days.

(21) Appl. No.: 12/109,522

(22) Filed: Apr. 25, 2008

(65) Prior Publication Data

US 2008/0265927 A1     Oct. 30, 2008

Related U.S. Application Data

(60) Provisional application No. 60/914,284, filed on Apr. 26, 2007.

(51) Int. Cl.
  *G01R 31/00* (2006.01)
  *G01R 1/067* (2006.01)

(52) U.S. Cl. .......... 324/750.16; 324/756.03; 324/755.07

(58) Field of Classification Search .................. 324/762
  See application file for complete search history.

(56) References Cited

U.S. PATENT DOCUMENTS

| | | | |
|---|---|---|---|
| 5,670,889 A * | 9/1997 | Okubo et al. ................. 324/760 |
| 5,773,987 A * | 6/1998 | Montoya ....................... 324/757 |
| 5,945,834 A | 8/1999 | Nakata et al. |
| 6,005,401 A | 12/1999 | Nakata et al. |
| 6,323,663 B1 | 11/2001 | Nakata et al. |
| 6,329,827 B1 * | 12/2001 | Beaman et al. .......... 324/755.07 |
| 6,476,628 B1 * | 11/2002 | LeColst ....................... 324/765 |
| 6,891,385 B2 * | 5/2005 | Miller ...................... 324/750.08 |
| 6,967,493 B2 * | 11/2005 | Mori et al. ................... 324/754 |
| 7,084,656 B1 * | 8/2006 | Khandros et al. ........ 324/750.26 |
| 7,102,377 B1 * | 9/2006 | Blanchet et al. ............. 324/765 |
| 7,396,236 B2 * | 7/2008 | Eldridge et al. ............... 439/66 |
| 7,589,542 B2 * | 9/2009 | Khoo et al. ................... 324/754 |
| 2006/0154497 A1 | 7/2006 | Amemiya et al. |
| 2007/0007974 A1 * | 1/2007 | Chiu et al. .................... 324/754 |
| 2007/0247140 A1 * | 10/2007 | Mayder et al. ............. 324/158.1 |

* cited by examiner

*Primary Examiner* — Roberto Velez
(74) *Attorney, Agent, or Firm* — Holland & Hart LLP (57) ABSTRACT

A probe card assembly used to test electronic devices in an automated test equipment system. The probe card assembly includes a substrate having a plurality of through-holes contained therein and a plurality of electrical contact elements. Each of the plurality of electrical contact elements has characteristics of both a torsional beam and a cantilever beam design and is configured to scrub a test pad associated with the electronic device in two directions concurrently. The plurality of electrical contacts is configured to be magnetically aligned to the substrate. Each of the plurality of electrical contact elements is further configured to be removably adhered to the substrate thus allowing easy field replacement of individual electrical contact elements.

6 Claims, 7 Drawing Sheets

ELEMENT USABLE WITH THE METHOD, AND A STANDALONE PROBE CARD TESTER FORMABLE USING THE METHOD

CROSS-REFERENCE TO RELATED APPLICATION

This application claims priority from U.S. Provisional Patent Application Ser. No. 60/914,284 entitled "Method and Apparatus for Manufacturing a High Parallelism, Low Cost Probe Card using Magnetic Electrical Contacts with Optional Electronic Circuitry for Production Testing of Memory Devices," filed Apr. 26, 2007 which is hereby incorporated by reference in its entirety.

TECHNICAL FIELD

The present invention is related generally to automated test systems. More specifically, the invention is related to large substrate probe cards usable with 300 mm and larger substrate sizes.

BACKGROUND

Complexity levels of electronic device testing vary tremendously. Simple device testing may be performed with manual low-volume/low-complexity evaluations using perhaps an oscilloscope and voltmeter. Medium-scale testing may employ personal computer-based evaluation systems. Large-scale/high-complexity evaluations typically employ automated test equipment (ATE).

Manual and personal computer-based testing are typically applied when testing discrete devices, specific components of an integrated circuit, or portions of a printed circuit board. In contrast, ATE testing is used to test functionality of a plurality of complex integrated circuits (ICs) such as memory circuits or hundreds of dice on a wafer prior to sawing and packaging.

Figure 1:
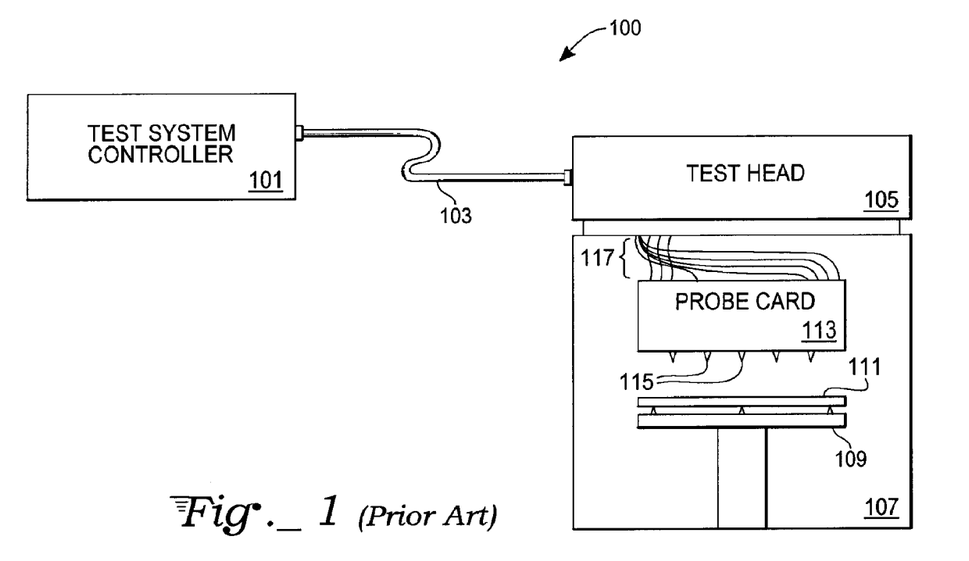
FIG. 1 is a block diagram of an ATE system of the prior art.

FIG. 1 shows a block diagram of a prior art automated test system 100. The test system 100 includes a test system controller 101, a test head 105, and a test prober 107. The test system controller 101 is frequently a microprocessor-based computer and is electrically connected to the test head 105 by a communication cable 103. The test prober 107 includes a stage 109 on which a semiconductor wafer 111 may be mounted and a probe card 113 for evaluating devices under test (DUTs) on the semiconductor wafer 111. The stage 109 is movable to contact the wafer 111 with a plurality of test probes 115 on the probe card 113. The probe card 113 communicates with the test head 105 through a plurality of channel communications cables 117.

In operation, the test system controller 101 generates test data which are transmitted through the communication cable 103 to the test head 105. The test head in turn transmits the test data to the probe card 113 through the plurality of communications cables 117. The probe card then uses these data to probe DUTs (not shown explicitly) on the wafer 111 through the plurality of test probes 115. Test results are then provided from the DUTs on the wafer 111 back through the probe card 113 to the test head 105 for transmission back to the test system controller 101. Once testing is completed and known good dice are identified, the wafer 111 is diced.

Test data provided from the test system controller 101 are divided into individual test channels provided through the communication cable 103 and separated in the test head 105 so that each channel is carried to a separate one of the plurality of test probes 115. Channels from the test head 105 are linked by the channel communications cables 117 to the probe card 113. The probe card 113 then links each channel to a separate one of the plurality of test probes 115.

Typical probe card assemblies, such as the probe card 113 of FIG. 1, are currently manufactured by various companies. However, typical contemporary types of probe card assemblies have several limitations. For example, in using a low-temperature co-fired ceramic (LTCC) substrate or a high-temperature co-fired ceramic (HTCC) substrate thick film process, a maximum size of the ceramic substrate is typically 150 mm (6 inches) square. However, the size of the wafer for typical memory devices is currently 300 mm (approximately 12 inches) diameter with 450 mm (approximately 18 inches) wafer diameters following shortly. Hence, several HTCC or LTCC substrates need to be tiled together to cover the surface of the wafer in a single pass. For example, four ceramic tiles are needed merely to cover the area of a single 300 mm wafer.

Tiling of HTCC or LTCC ceramic substrates creates a number of mechanical challenges. First, each of the plurality of substrates needs to be coplanar with each of the other substrates. Additionally, each of the four ceramic tiles needs to be individually aligned to DUTs on a wafer. This alignment necessitates a small gap to be placed between each of the tiles. As a result of the small gap, bond pads located in these same relative areas of the wafer cannot be contacted easily. Further, each of the tiles has a "keep-out" area around the perimeter of each tile. The keep-out area is required for handling during processing and is roughly 2 mm from each edge.

Other limitations include expensive processing requirements. For example, to laminate each subsequent layer, both the LTCC and HTCC substrates need to be co-fired after each layer is applied. Typical LTCC and HTCC substrates have up to 24 layers each and thus need to be co-fired 24 times, providing for an expensive process. Also, since the LTCC and HTCC substrates use thick film processes for their fabrication, a typical photolithographic process which uses a wet chemical etch can only define 25 μm to 50 μm (1 mil to 2 mil) wide traces. The large trace widths greatly limit the routing density available within the substrate.

Since the HTCC substrate is fired at over 900° C., traces are typically made of tungsten (W) to withstand the heat. However, tungsten is highly resistive (having approximately only 20% the conductivity of copper (Cu)) and therefore degrades the signal fidelity of the ATE system. The LTCC substrate is fired at 300° C. and the traces are usually made of a gold-based alloy which is also fairly resistive (approximately 80% the conductivity of Cu), although less resistive than tungsten.

In another example of limitations of contemporary substrates, the HTCC substrate from one manufacturer, for instance, features a modified wire bonder to make a contact element that is ball bonded to the HTCC substrate. The other end of the wire bond contacts the wafer. However, an overall vertical height of the wire bond is only 1 mm. The vertical height limits an available thickness of any bypass capacitors that can be mounted on the wafer side of the HTCC substrate. Most high frequency capacitors are made of COG-grade materials and are approximately 1.0 mm thick. Hence, a lower grade capacitor material, such as X7R or Y5V (known in the art), must be used. The lower grade capacitors are thinner but have a bandwidth limitation of about 500 MHz. The frequency of the current generation of DRAM is 533 MHz, so these lower grade materials may work fairly adequately. However, the next generations of DRAM will run at 800 MHz and 1.066 GHz, respectively. Therefore, these lower grade capacitance materials will no longer be adequate.

The LTCC substrate from one prior art manufacturer features a MEMs-based contact that has a vertical height of roughly 0.3 mm (i.e., 300 μm). The vertical height in this case prohibits bypass capacitors from being mounted on the wafer side of the ceramic substrate at all. The MEMs-based technology requires any bypass capacitors to be placed on the printed circuit board (PCB). The PCB is several millimeters away from the DUT and thus creates added inductance and other parasitic reactance levels. The added inductance alone limits the performance of the bypass capacitors to less than 100 MHz and excludes such probe cards from testing contemporary DRAM devices running at 533 MHz.

Therefore, what is needed is a means to simply and economically test DUTs contained on large-area substrates in high speed applications, preferably with a single touchdown onto the substrate.

SUMMARY OF THE INVENTION

In an exemplary embodiment, a probe card assembly used to test electronic devices in an automated test equipment system is disclosed. The probe card assembly includes a substrate having a plurality of through-holes contained therein and a plurality of electrical contact elements. Each of the plurality of electrical contact elements has characteristics of both a torsional beam and a cantilever beam design and is configured to scrub a test pad associated with the electronic device in two directions concurrently. Each of the plurality of electrical contact elements is configured to be removably adhered to the substrate.

In another exemplary embodiment, a component of a probe card assembly used to verify a variety of electrical characteristics of a device under test is disclosed. The component is comprised of an electrical contact element. The electrical contact element is shaped so as to have mechanical characteristics of both a torsional beam and a cantilever beam. The mechanical characteristics allow the electrical contact element to scrub a test pad associated with the device under test in two directions concurrently when mounted to a substrate. The electrical contact element is configured to be removably adhered to the substrate.

In another exemplary embodiment, a method of fabricating a probe card assembly is disclosed. The method includes forming a plurality of electrical contact elements where each of the plurality of electrical contact elements is formed to have mechanical characteristics allowing each of the contact elements to scrub in two directions concurrently when mounted to a substrate, and forming a plurality of through-holes in the substrate. The plurality of through-holes is arranged to allow each of the plurality of electrical contact elements to contact a device under test on a wafer.

In another exemplary embodiment, a stand-alone probe card tester used to test an electronic device is disclosed. The stand-alone probe card tester comprises a substrate having a plurality of through-holes contained therein and a plurality of electrical contacts. Each of the plurality of electrical contact elements has characteristics of both a torsional and cantilever beam design and is configured to scrub a test pad associated with the electronic device in two directions concurrently. Each of the plurality of electrical contact elements is configured to be removably adhered to the substrate.

BRIEF DESCRIPTION OF THE DRAWINGS

The appended drawings merely illustrate exemplary embodiments of the present invention and must not be considered as limiting its scope.

DETAILED DESCRIPTION

The present invention replaces typical HTCC or LTCC thick film ceramic substrates with a thin film substrate. In an exemplary embodiment, routing layers in the present invention are deposited by, for example, dielectric sputtering and/or standard $SiO_2$ wet or dry oxide growth processes. The dielectric formation method eliminates any need for co-firing the ceramic substrate thereby allowing metallization layers to be fabricated from copper instead of tungsten or a gold alloy. Using copper greatly lowers resistivity of the traces. Additionally, enabling thin film technologies in fabrication of the substrates of the present invention allows much smaller trace widths to be formed. In contrast with the 25-50 µm trace widths possible under the prior art utilizing thick film processes, trace widths of 5 µm or less can readily be fabricated with the present invention. The smaller trace widths greatly increase the routing density and pathways of traces in the ceramic substrate.

In an exemplary embodiment, an alumina ($Al_2O_3$) substrate is employed to allow compatibility with 300 mm or larger substrates. Other types of materials may also be readily employed. As a result of using larger substrates, mechanical issues associated with 150 mm square substrates are eliminated. The larger substrate size allows the use of standard semiconductor process equipment to deposit dielectric and metallization layers, reducing the cost of processing the ceramic.

The prior art used contact elements formed from either a modified wire bonder or a MEMs-based process. In contrast, contact elements of the present invention, in an exemplary embodiment, are formed by stamping a material with at least some of the following characteristics: (1) magnetic; (2) non corroding before or after external plating; (3) good spring constant; (4) sufficient hardness to contact aluminum pads on a silicon wafer (or other materials); (5) attachable to a substrate by solder or conductive epoxy; and (6) low cost.

In other exemplary embodiments, the contact elements may be formed by plating up material on a carrier material and etching the contact with a photolithographic process to define its features. After plating one or more materials on the carrier material, the carrier material is subsequently dissolved to free the contact elements from the carrier material. Such photolithographic and plating processes and techniques are recognizable and may be applied to the contact elements upon reading and understanding the additional material disclosed herein. Examples of materials suitable for contact element formation (for either the stamping process or the plating process) include stainless steel (e.g., such as 440 or 416 stainless), tool steel, or nickel. Other materials may be used if they conform to at least certain aspects of the characteristics listed above.

Figure 2:
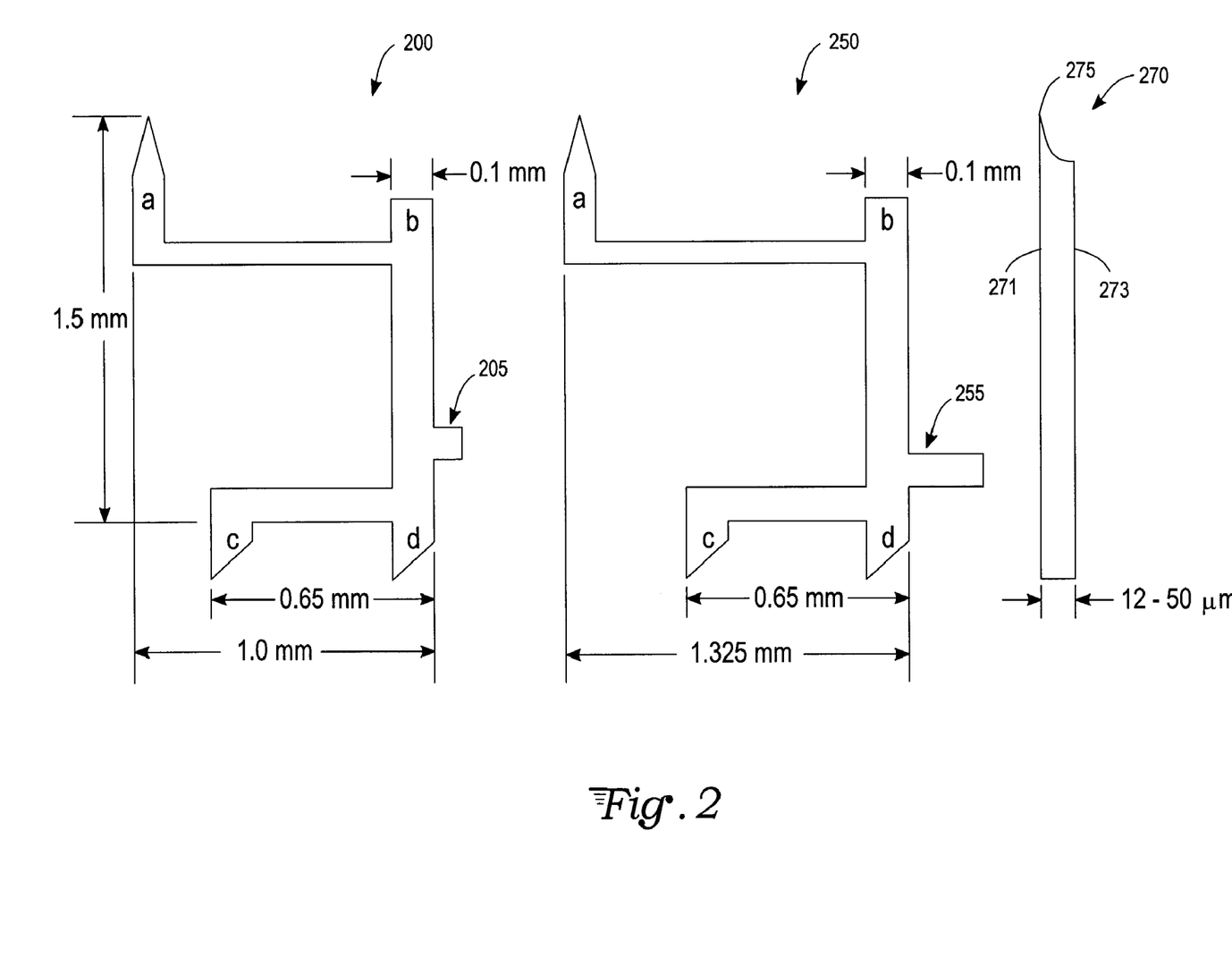
FIG. 2 shows exemplary contact elements in accord with various aspects of the present invention.

With reference to FIG. 2, an exemplary embodiment of a first type contact element 200 and a second type contact element 250 provides overall shape and dimensional references. Upon reading and understanding the material disclosed herein, a skilled artisan will recognize that the exact shape and dimensions are purely exemplary and other shapes and dimensions may readily be used. An overall height of the each of the contact elements 200, 250 is approximately 1.5 mm, sufficient to allow mounting of a typical integrated circuit thereunder. With the dimensions shown, the working travel of each of the contact elements 200, 250 will range from 75 μm to 250 μm (3 mils to 10 mils). The material may be, for example, 12 μm to 50 μm in thickness.

In a specific exemplary embodiment, each of the contact elements 200, 250 is used for the probe card assemblies. The first type contact element 200 has a short handling feature 205. The second contact element has a long handling feature 255. Other than the handling features 205, 255, the contact elements 200, 250 are similar to one another. The first type contact element 200 is 1.0 mm wide and the second type contact element 250 is 1.325 mm wide. Each of the features labeled "a" through "d" will be discussed and the handling elements 205, 255 will be discussed with reference to FIG. 8, below.

Neither the first type contact element 200 nor the second type contact element 250 are purely cantilever beams or torsional beams. Rather the first type contact element 200 and the second type contact element 250 are each a combination of cantilever and torsional beams. In a specific exemplary embodiment, a side view 270 of the contact elements 200, 250 indicates a sharp tip 275 with a 2.5 μm radius is located on the back side 271 as opposed to the front side 273 of the contact elements 200, 250. During fabrication of the 12 μm to 50 μm thickness of metal comprising the contact elements 200, 250, the etching process used combined with the photolithographic process or the post polishing process performed along with the stamping process produces the sharp tip 275. Additionally, the overall shape of the contact elements 200, 250 allows the 50 μm thick beam to twist as well as bend. One purpose of having two different width contacts (i.e., 1.0 mm and 1.325 mm) and handling features 205, 255 is to increase a distance between via holes on the ceramic substrate (described in more detail, below) to beyond the 250 μm minimum limit typically required of a controlled collapse chip connection (C4) or controlled collapse chip carrier connection (C5) bumping process commonly known in the art.

Each of the contact elements 200, 250 is soldered to the alumina substrate using, for example, a C4 bumping process. Alternatively, a silver epoxy process may be used instead of a solder process. Due to the increased height of the contact, high frequency capacitors may be mounted on the same side of the ceramic substrate as the wafer. The increased height allows the probe card assembly to be used at frequencies well over 1 GHz or 2 Gbit (DDR).

As noted above, prior art schemes limit the use of capacitors to bypass the $V_{CC}$ supply voltage of DUTs to 500 MHz or 1 GBit (DDR). Similarly, the low profile of another prior art contact (MEMs-based contact) limits the performance of the bypass capacitors to 100 MHz or 200 Mbit (DDR). Placing the bypass capacitors on the PCB side of the ceramic increases the inductance of the capacitors and thus is unacceptable for testing contemporary DRAM devices.

Figure 3:
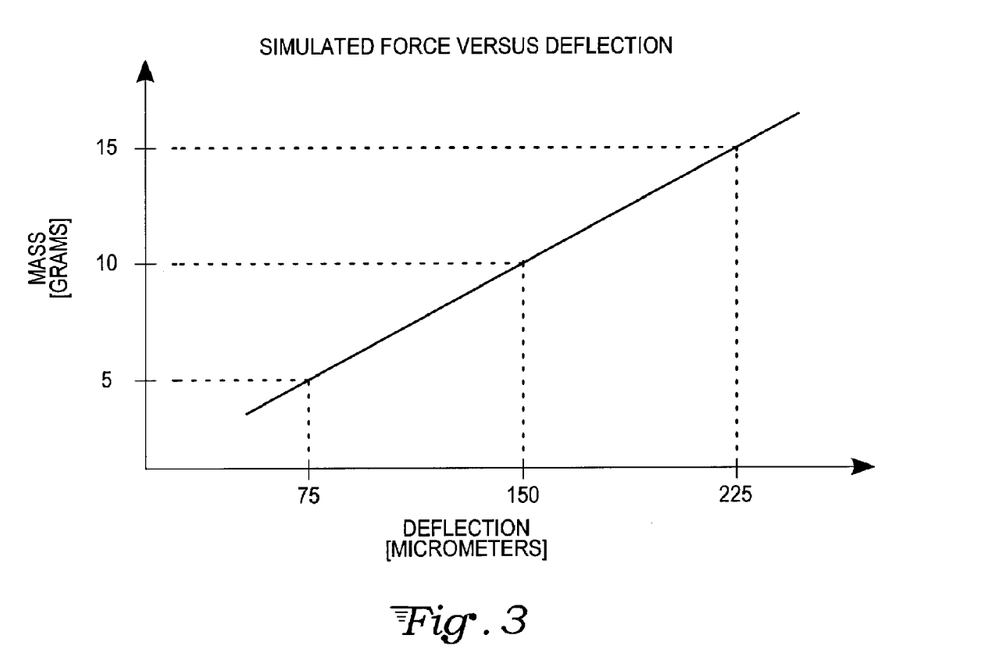
FIG. 3 is a simulated force versus deflection curve for the exemplary contact elements of FIG. 2.

FIG. 3 is a graph of a simulated force versus deflection curve of the contact elements 200, 250 employing the exemplary dimensions of FIG. 2. For example, a force of 0.1 N (approximately equivalent to 10 grams of mass applied to the contact elements 200, 250) produces a deflection of 150 μm. One of skill in the art will recognize that force-deflection curves may be modified as needed through a choice of materials and dimensions used in the contact elements.

Figure 4:
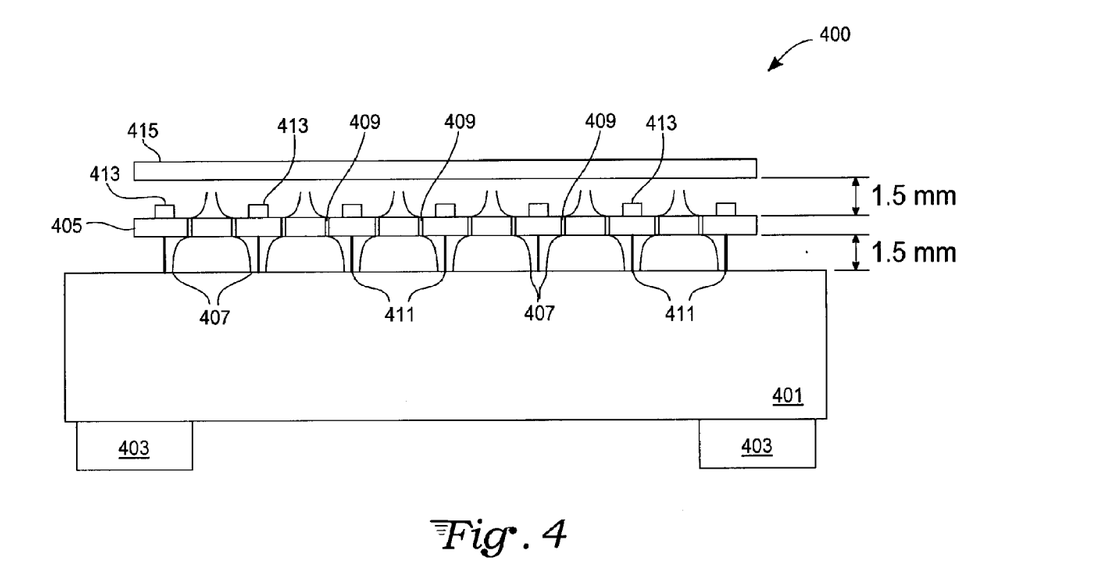
FIG. 4 is an exemplary cross-sectional view of a probe card assembly using the contact elements of FIG. 2.

FIG. 4 is a cross-sectional view illustration of an exemplary probe card assembly 400 shown in relation to a 300 mm wafer 415. The probe card assembly 400 includes a printed circuit board 401 having a plurality of ATE connectors 403 and a ceramic substrate 405. In a specific exemplary embodiment, the printed circuit board 401 is approximately 6.2 mm thick and laterally measures roughly 440 mm to 600 mm in diameter. The diametrical size of the printed circuit board 401 may be varied depending upon a relative size of the wafer of other substrate containing the DUTs.

The printed circuit board 401 routes signals via traces (not shown) from the ATE connectors 403 to a plurality of contact elements 407 located on the printed circuit board 401 side of the ceramic substrate 405. The printed circuit board 401 may contain ASICs (not shown) for fanning out tester resources. One particularly advantageous ASIC is called the FLASHENHANCER™. U.S. Pat. No. 7,348,791, issued Mar. 25, 2008 describing the FLASHENHANCER™ is commonly assigned to Silicon Test Solutions. In addition to the FLASHENHANCER™, there may be other ASICs and/or discrete devices located on the printed circuit board 401. The other ASIC types include, for example, algorithmic pattern generators (APGs), precision measurement units (PMUs), error capture RAM (ECR), driver/receiver circuitry, formatter circuitry, timing generator circuitry, vector memory, test site controllers, and programmable power supplies.

In another exemplary embodiment, the printed circuit board 401 may include an entire tester (not shown) and thus, an external ATE system may not be required. Such an embodiment may be considered to be "a tester on a probe card." The electronic circuitry may be located directly on the printed circuit board 401, in sockets (not shown), or on daughter boards (not shown). The daughter boards may be used to replace the ATE connectors 403. None, some, or all of the electronic circuitry may be mounted on the ceramic substrate 405 as well.

Material to fabricate the printed circuit board 401 may be comprised of, for example, any of the organic materials known in the art such as standard FR-4 material. Additionally, DICLAD®, CUCLAD®, and other laminates (available from Arlon-MED, Rancho Cucamonga, Calif.), Park-Nelco 4000-13 (available from Park Electrochemical Corporation, Anaheim, Calif.), Rogers 3000/4000, DUROID® and other laminates (available from Rogers Corporation, Rogers Conn.), DURAVER® and other laminates (available from Isola GmbH, Dueren, Germany) as well as other materials may be employed. A plurality of vias in the printed circuit board 401 may be fabricated using stacked vias, blind vias, buried vias, micro vias, and thru-hole vias 409 or any other via type known to one skilled in the art.

The ceramic substrate 405 may be polished alumina or another material onto which thin films may be deposited. In a specific exemplary embodiment, eight layers of dielectric thin film layers may be deposited on each side of the ceramic substrate 405 thus providing a total of 16 routing layers. The dielectric thin film layers may include silicon dioxide ($SiO_2$), silicon nitride ($Si_3N_4$), tantalum nitride (TaN), tantalum pentoxide ($Ta_2O_5$) or other appropriate material. The layers may be deposited by sputtering, chemical vapor deposition (CVD), or another appropriate process technology.

Electrical traces (not shown) in the ceramic substrate 405 may be aluminum, copper, or another appropriate conductive material. The traces may be etched in geometries as small as 5 μm or less with wet or dry etch processes known in the art.

The dielectric deposition and metallization layers may be processed with even previous generations of processing equipment utilized by the semiconductor industry due to the relatively large feature dimension sizes employed. The ceramic substrate 405 may have the plurality of via thru-holes 409 electrically connect opposing sides of the ceramic substrate 405 to one another. The diameter of the plurality of via holes 409 may range from 25 µm to 200 µm and may be fabricated by mechanical drilling, laser drilling, electrical discharge machining (e.g., wire EDM or micro-EDM), or other appropriate technology known to one skilled in the art.

With continued reference to FIG. 4, a cross-sectional view of a plurality of mechanical compression elements 413 is used to clamp the ceramic substrate 405 to the printed circuit board 401. The plurality of mechanical compression elements 413 are discussed in detail, below. A plurality of planarization elements 411 helps assure flatness of the ceramic substrate 405 with reference to both the 300 mm wafer 415 and the printed circuit board 401. The plurality of planarization elements 411 is discussed in more detail with reference to FIG. 5, below.

Figure 5:
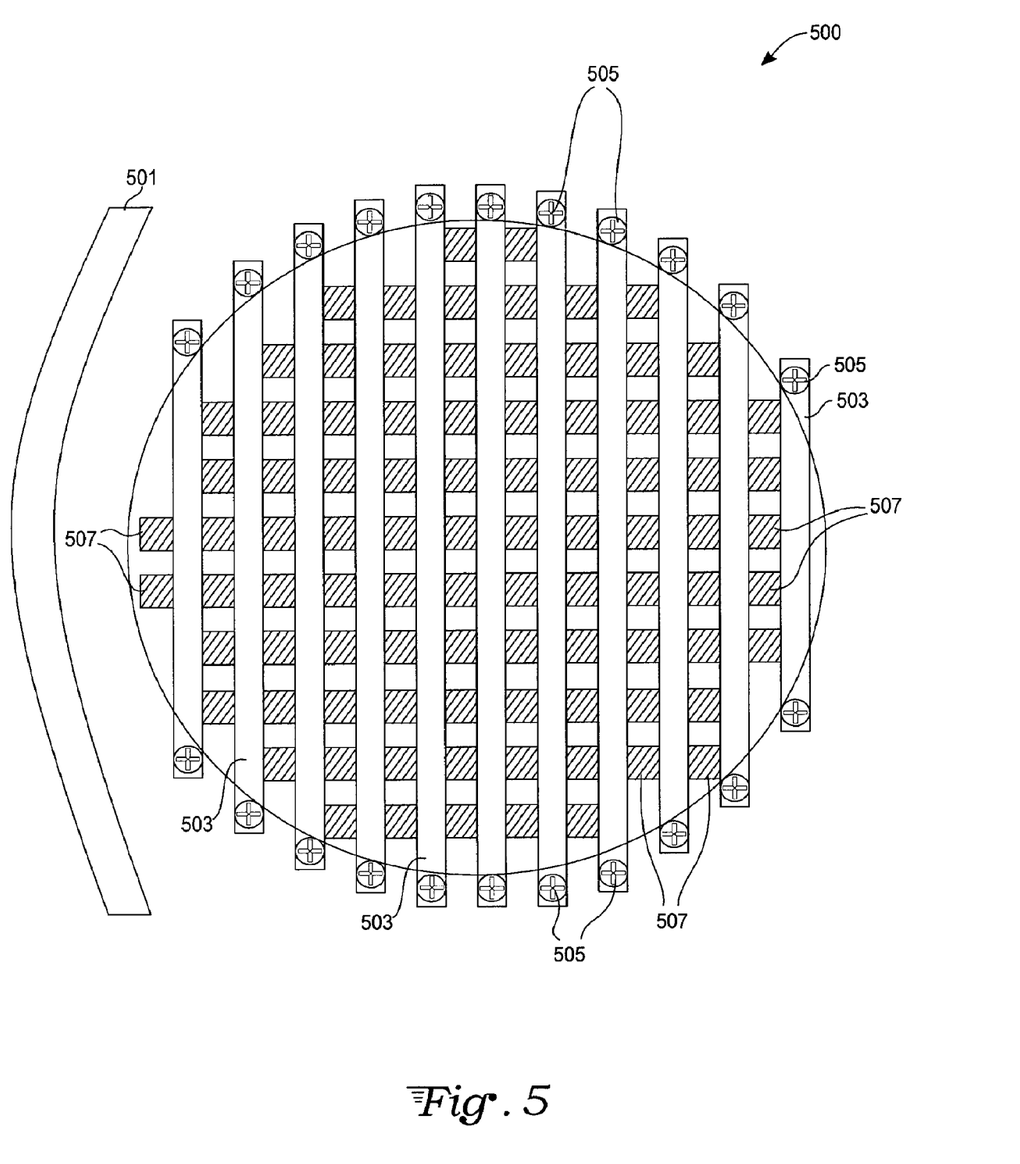
FIG. 5 is an exemplary clamping mechanism used to secure a ceramic substrate to a printed circuit board.

With reference to FIG. 5, an exemplary clamping mechanism 500 used to secure the ceramic substrate 405 to a printed circuit board (not shown in FIG. 5). The exemplary clamping mechanism 500 includes a plurality of spring steel bars 503. Each of the plurality of spring steel bars 503 may be the same or similar to the plurality of mechanical compression elements 413 shown in cross-section in FIG. 4. Each of the plurality of spring steel bars 503 produces a clamping force by attaching at least two hold-down screws 505.

In a specific exemplary embodiment, the exemplary clamping mechanism 500 is located on the wafer side of the ceramic substrate 405. Each of the plurality of spring steel bars 503 is 1 mm thick and 2 mm wide. The plurality of spring steel bars 503 are formed into the shape of a mathematical cycloid 501 or other quadratic shape. The shape allows even pressure to be applied to the ceramic substrate 405 when attaching each of the plurality of spring steel bars 503 to the printed circuit board with the at least two hold-down screws 505. The at least two hold-down screws 505 are each located at an outer perimeter of the ceramic substrate 405. The plurality of spring steel bars 503 are typically run parallel to one another and are located along the streets of the wafer (not shown) where the wafer would be diced. FIG. 5 indicates the relative position of a plurality of DUTs 507 located on the wafer with respect to the plurality of spring steel bars 503.

With continued reference to FIG. 5 and referring back to FIG. 4, the flatness of the printed circuit board 401 (FIG. 4) and the ceramic substrate 405 may be insufficient to ensure that each of the plurality of contact elements 407 will contact the flat wafer due to the limited working travel of the plurality of contact elements 407. Therefore, the plurality of planarization elements 411 may be used to allow the ceramic substrate 405 to be flat relative to the wafer 415. The plurality of planarization elements 411 may be comprised of, for example, simple machined pieces of aluminum of proper thickness. Alternatively, the plurality of planarization elements 411 may be more elaborate, utilizing an electrostatic attraction by applying a varying amount of high voltage to various parts of the ceramic substrate 405 and grounding the top layer of the printed circuit board 401. A skilled artisan will recognize other types of planarization techniques may be employed for the plurality of planarization elements 411.

In an exemplary embodiment, the plurality of contact elements 407 (FIG. 4) may be soldered to the ceramic substrate 405 on both sides using, for example, either a C4 or C5 bumping process to place solder balls on the ceramic directly adjacent to the mating surface on the contact elements. During the heating process, the solder flows and attaches the stamped contact to the ceramic substrate 405. Alternatively, silver epoxy or other conductive epoxy or attachment methods known in the art may be used in place of the solder process.

When using a C4 or C5 process technology to place the solder bumps on the ceramic substrate 405, there is traditionally a limitation of a 250 µm pitch in X and Y directions. Hence, the solder balls may be staggered on the ceramic substrate 405.

Figure 6:
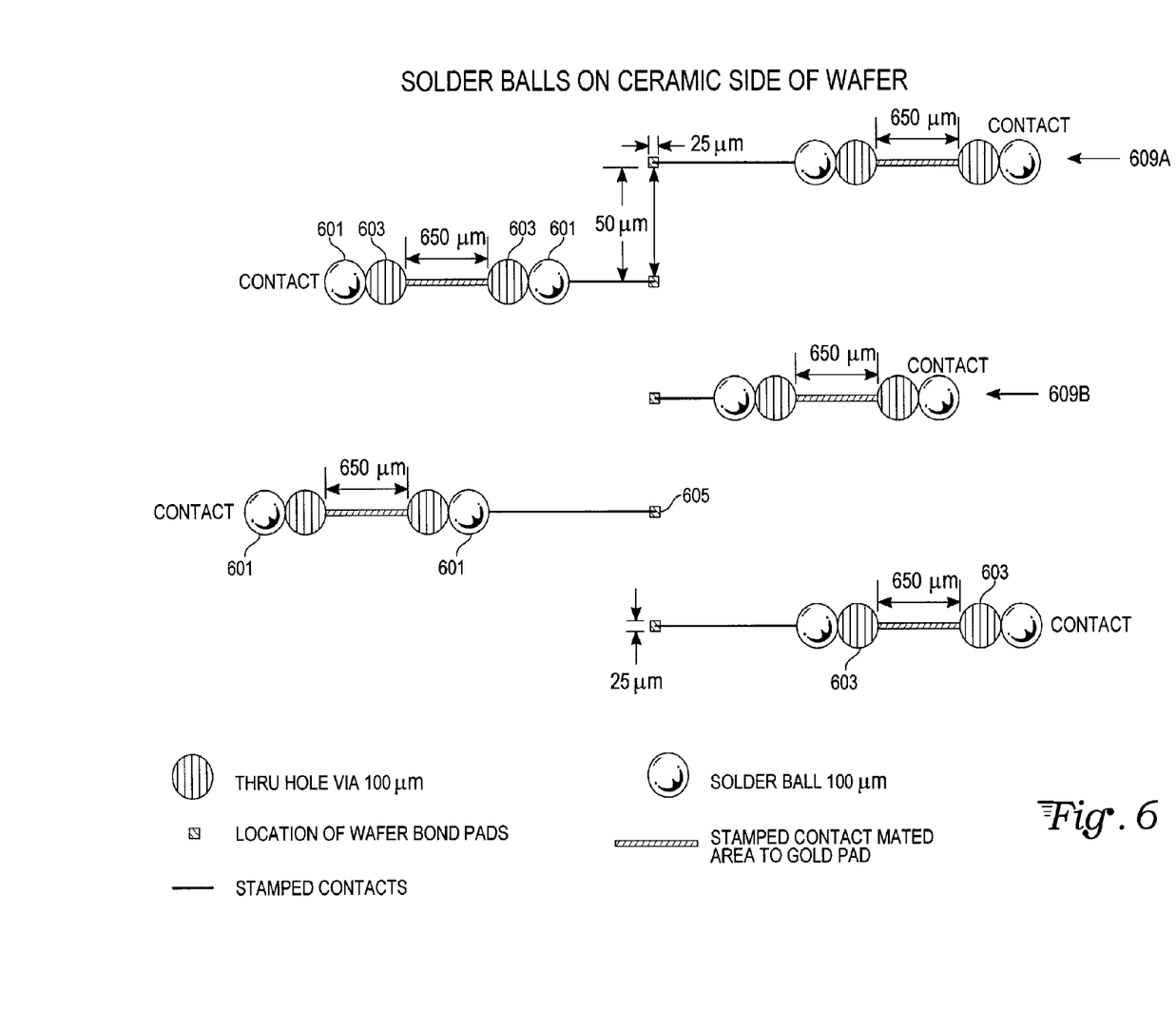
FIG. 6 shows an exemplary graphical illustration of a plurality of via hole and solder ball locations of a ceramic substrate used in the probe card assembly of FIG. 4.

Referring now to FIG. 6, an exemplary arrangement of the staggering of a plurality of solder balls 601 and a plurality of through-holes 603 is achieved by having a first length contact 609A and a second length contact 609B. The plurality of through-holes 603 are contained within the ceramic substrate 405 (FIGS. 4 and 5). The first length contact 609A and the second length contact 609B allow mating the ceramic substrate 405 (not shown in FIG. 6) with a wafer (e.g., the wafer 415 of FIG. 4) having a plurality of 25 µm bond pads 605 and a 50 µm pitch with bond pads located down the center of an electronic device. The plurality of bond pads 605 are typically contained down the center of each of a plurality of electronic dice (not shown) fabricated on, for example, the wafer 415 (FIG. 4). The contact elements (e.g., the first 200 and second 250 type contact elements, FIG. 2) are fanned out from the centrally-located bond pads 605 thus helping to increase a physical distance between each of the plurality of through-holes 603. Thus, the contact elements may be arranged to be fanned out, for example, half to the left of the plurality of through-holes 603 and the remaining half to the right of the plurality of through-holes 603. The contact elements arranged to fan out, for example, to the right, may have alternating arrangements of the first type contact element 200 having the short handling feature 205 with the second type contact element 250 having the long handling feature 255. The dimensions given are common bond pad sizes, pitches, and locations for a typical contemporary memory device.

The ceramic substrate 405 (not shown in FIG. 6) may be plated with gold over a final metallization layer. Since solder has a high affinity for gold, melted solder flows over the entire gold pad. The gold plating may be very thin, for example about 125 nm (approximately 5 micro inches) to avoid gold embrittlement of the solder joint.

Figure 7:
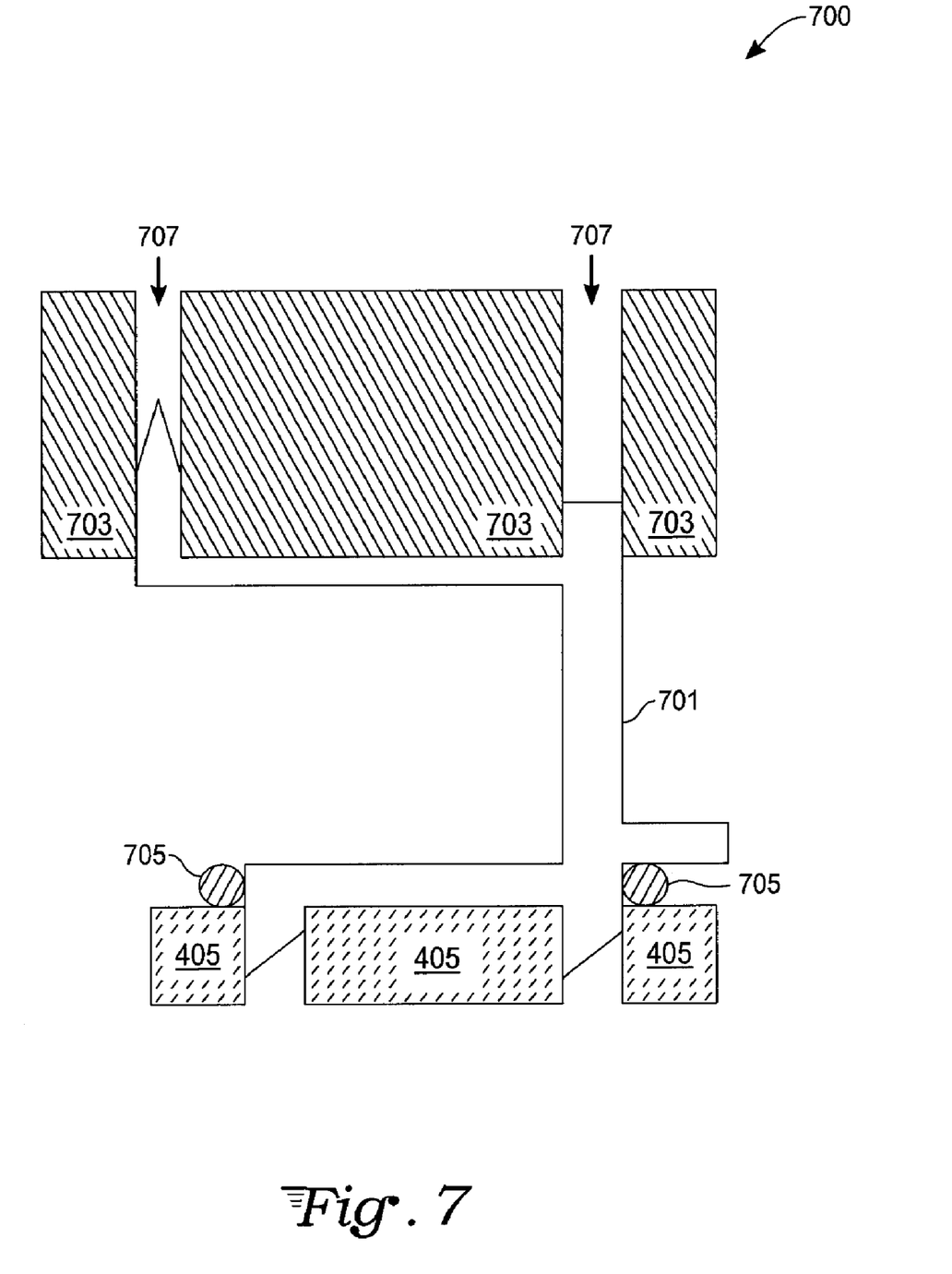
FIG. 7 is an exemplary magnetic alignment jig used to position either of the contact elements of FIG. 2.

With reference to FIG. 7, prior to melting the plurality of solder balls 601 (FIG. 6) that is placed on the ceramic substrate 405, an exemplary cross-section of a contact assembly alignment jig 700 to be soldered includes a contact element 701. The contact element 701 may be any of the types of contact element 200, 250 previously described with reference to FIG. 2. In a specific exemplary embodiment, a magnetic alignment jig 703 is used so that the contact element 701, fabricated from, for example, 440 stainless steel (or other ferro-magnetic material) will be attracted to the magnetic alignment jig 703 and remain secured in place until one or more solder balls 705 are melted to semi-permanently secure the contact element 701 into place.

Alignment holes 707 in the magnetic alignment jig 703 may be round or any other shape to temporarily secure the contact elements 701 in place. The alignment holes 707 may be fabricated with, for example, a wire EDM process or laser-drilling process. Either process used to form the alignment holes 707 can achieve better than 2.5 µm accuracy. However, such a high level of accuracy is not necessarily required to fabricate the alignment holes 707 in the magnetic alignment jig 703. If the contact elements 701 are damaged or otherwise need replacement, they may be replaced by desoldering the existing contact elements 701 and securing new contact elements 701 using the magnetic alignment jig 703. Thus, the contact elements 701 may be replaced readily in the field.

Figure 8:
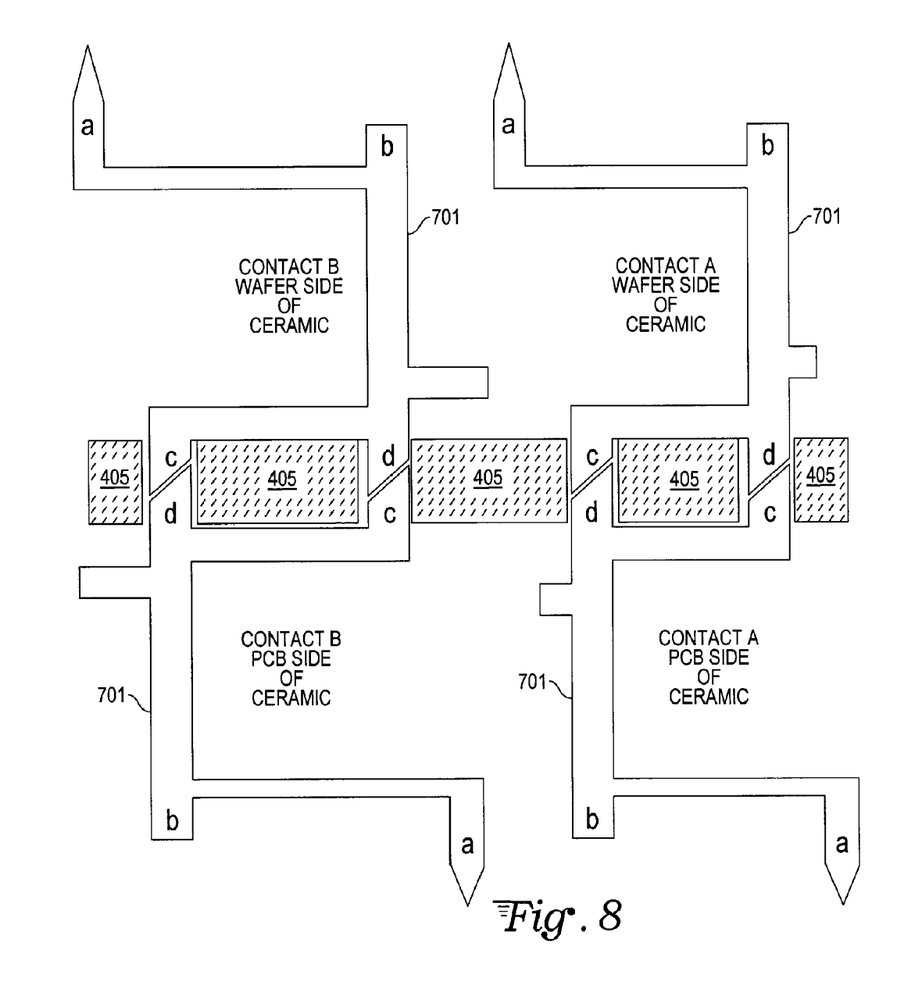
FIG. 8 is an exemplary arrangement of the contact elements of FIG. 2 mounted on opposing sides of a ceramic substrate.

With reference now to an exemplary embodiment of FIG. 8 and continued reference to FIG. 7, alignment features "a" and "b" on the contact elements 701 are used to set an overall height of the contact elements 701 in addition to an X-Y alignment within the magnetic alignment jig 703. Alignment features "c" and "d" are used to set the X-Y alignment with the ceramic substrate 405. The contact elements 701 are attracted to the magnetic alignment jig 703 (FIG. 7). Thus, the alignment features "c" and "d" will float over the via holes in the ceramic substrate 405 since the magnetic alignment jig 703 and the ceramic substrate 405 may not be exactly parallel with respect to one another. An optional electromagnet (not shown) may be placed on top of the magnetic alignment jig 703. The optional electromagnet temporarily increases the magnetic attraction of the magnetic alignment jig 703 during the heating of the solder paste to ensure positional accuracy of the contact elements 701 is maintained during the solder process. Power to the electromagnet may be applied during the heating process and then power would be removed afterwards to facilitate removal of the magnetic alignment jig 703.

In another embodiment, small (e.g., 10 μm×10 μm) electromagnets (not shown) are formed with a lithographic process on a flat substrate (not shown). The flat substrate could be, for example, silicon although any other flat substrate capable of undergoing semiconductor fabrication processes may be used as well. In this embodiment, the contact elements 701 are set into the via holes of the ceramic substrate 405. Then the flat substrate with embedded electromagnets is positioned over the contact elements 701 at an appropriate height and planarity. When current is applied to the electromagnets, the contact elements 701 are attracted to a correct positional location in X, Y, and Z and alignment features "c" and "d" will float in the via holes of the ceramic substrate 405. In this case, the via holes in the ceramic substrate 405 perform a coarse alignment of the contact elements 701 and the small electromagnets (not shown) perform a fine alignment. The small electromagnets may be, for example, approximately 25% the size of the bond pads, assuring the contact elements 701 are properly aligned.

With continued reference to FIG. 8 and reference again to FIG. 2, each of the handling features 205, 255 located on each of the contact elements 701 are physically located in different locations to allow maximum space for any manual adjustment of the contact elements 701 which may be required prior to soldering. Also, the magnetic alignment jig 703 (FIG. 7) may have slots routed out near bond pad locations to allow alignment access to the contact elements 701 with, for example, tweezers.

FIG. 8 also indicates how the contact elements 701 may be installed on both sides of the ceramic substrate 405 in an exemplary embodiment. Either the same or similar contact elements 701 may be used in each location on the PCB side of the ceramic substrate 405.

As shown, the contact elements 701 are rotated by 180 degrees with respect to opposing sides of the ceramic substrate 405. This arrangement concentrates the load of compressing the contact elements 701 located on the PCB side of the ceramic directly underneath the plurality of spring steel bars 503 (FIG. 5). Additionally, this arrangement fans-out the pitch of the contact points to 0.65 mm, which is typically a minimum PCB board pitch.

The width of the contact elements 701 is a trade-off between placing all the contacts within the size of a contacted die (not shown) and the pitch requirements of the PCB. For large dice there can be a large PCB pitch. For small dice, a small PCB pitch is needed. In a specific exemplary embodiment, the given contact width of contact elements 200, 250 (FIG. 2) supports a die which is 4 mm wide and a PCB board pitch of 0.65 mm. These are both minimum sizes for contemporary memory devices and PCB pitch requirements. Memory die sizes usually stay constant even though transistor technology continues to shrink since memory density increases (number of memory cells) for new applications.

Since the exemplary contact elements 200, 250 (FIG. 2) are small, only 1.0 mm to 1.325 mm in width, all the contact elements 200, 250 for each DUT may be placed within the area of each DUT without having to fan-out to neighboring DUTs. For example, NOR-type Flash memory is fabricated on the smallest die size. Typical NOR-type Flash memory DUTs are 4 mm-6 mm wide. Hence, a probe card assembly may be assembled that can contact all the DUTs on a 300 mm diameter or larger wafer in parallel.

Prior art systems require fanning out the contact elements beyond the DUT and thus a 300 mm wafer requires the ceramic to be significantly larger than 300 mm. Currently, a ceramic substrate larger than 300 mm does not exist. Thus, users of the prior art must tile several ceramics on the same printed circuit board.

Advantages Over the Prior Art

Various embodiments of the present invention provide several significant advantages over the prior art. Some of these advantages include: higher frequency performance (operating at up to a 2 Gbit or higher bandwidth); one touchdown per, for example, a 300 mm wafer fabricated with DRAM integrated circuits as compared with four touchdowns (without tiling); field replaceable contact elements; and a significantly lower overall cost (roughly a factor of 5 to more than 10 times cost reduction).

Common thin film processes are used in producing the ceramic substrates described herein. Also, geometries of patterned layers used in producing routing layers on the substrates are large in comparison with state-of-the-art integrated circuits. Thus, the ceramic substrates of the present invention may be fabricated utilizing older generation semiconductor equipment for photolithography, patterning, and other fabrication steps.

Also, the contact elements do not require plating as many types of ferro-magnetic materials may be cut, stamped, or otherwise formed directly. The lack of plating improves reliability over the prior art and further reduces costs. Additionally, the contact element that is used between the wafer and the ceramic is the same or similar to the contact element used between the ceramic and the printed circuit board. These standardized production techniques further reduce costs.

The contact elements are tall enough to use a mechanical clamping mechanism mounted on the wafer side of the ceramic resulting in a cost effective system. By using the same or similar contact elements in the same via holes on both the wafer side and PCB side of the ceramic, the compression force of the contacts on the PCB side is concentrated directly underneath the spring steel bars. In contrast, the prior art uses elaborate and labor intensive clamping mechanisms. The prior art mechanisms create long lead times for product production and testing thus further contributing to significant cost increases.

Under the prior art, a scrub mark left on the aluminum pad used for testing a DUT on a wafer is usually one dimensional. For example, the cantilever beam used by one prior art manufacturer scrubs in one direction. The torsional beam employed by another prior art manufacturer scrubs in only one direction as well. However, the direction for the torsional beam is orthogonal to the scrub direction of the cantilever beam. Since the aluminum bond pad is typically a 25 µm square, both of the prior art systems are limited to a 25 µm scrub mark. In contrast, the present invention may scrub in both directions concurrently due to the combination torsional and cantilever beam design. Thus, beams of the present invention may scrub along the diagonal of the bond pad and can have approximately a 35 µm (i.e., $\sqrt{2}\cdot25$ µm) scrub mark. The longer scrub mark allows for a better contact to the bond pad but also allows for a larger range stroke in the Z-direction of the contact elements. The additional stroke length allows better compensation for any planarity differences between the wafer and the contact elements.

Significantly, in addition to some of the advantages presented above, the present invention may also include all electronic circuitry to be located on the probe card assembly to test an entire 300 mm wafer of electronic devices, such as integrated circuit memory devices and thus eliminate the need for an additional ATE system.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, a skilled artisan will recognize that alternative techniques and methods may be utilized to form or stamp the contact elements described herein. In addition to mechanical forming or stamping, techniques such as electron beam (e-beam) lithography, x-ray lithography, or standard lithography utilizing phase shifted masks may all be considered. Also, the contact element shapes described are merely exemplary. A skilled artisan will readily envision numerous other shapes possessing the same or similar advantages described. The alternative techniques, shapes, and methods are still included within a scope of the appended claims. Also, there are frequently several techniques used for forming a material. Although not all techniques are amenable to all material types that may be utilized, one skilled in the art will recognize that multiple methods for fabricating a material may be used. Also, various alloys, compounds, and multiple layers of stacked materials may be used. A skilled artisan further will recognize other circuit elements which may be used instead of or in addition to circuit components described herein. Significantly, although the probe card assembly is described as being a component of an ATE system, the assembly may be mixed with specific ASIC designs known in the art to provide a stand-alone tester circuit, thus not requiring an ATE system. These and various other embodiments and techniques are all within a scope of the present invention. The specification and drawings are, accordingly, to be regarded in an illustrative rather than a restrictive sense.

What is claimed is:

1. A method of fabricating a probe card assembly, the method comprising:
    forming a plurality of electrical contact elements, each of the plurality of electrical contact elements being formed to have mechanical characteristics allowing each of the contact elements to scrub in two directions concurrently when mounted to a substrate;
    forming a plurality of through-holes in the substrate, the plurality of through-holes arranged to allow each of the plurality of electrical contact elements to contact a device under test on a wafer;
    magnetically aligning a first set of the plurality of electrical contact elements to respective pairs of through-holes on a first side of the substrate;
    magnetically aligning a second set of the plurality of electrical contact elements o respective pairs of through-holes on a second side of the substrate; and
    securing the first set and the second set of the plurality of electrical contact elements to the substrate.

2. The method of claim 1 further comprising:
    fabricating a plurality of electrical traces on the substrate;
    electrically coupling certain ones of the first and second sets of the plurality of electrical contact elements to the electrical traces;
    producing a printed circuit board having a plurality of bonding pads arranged to align with the second set of the plurality of electrical contact elements;
    contacting the second set of the plurality of electrical contact elements with certain ones of the bonding pads on the printed circuit board; and
    clamping the substrate to the printed circuit board with a plurality of spring bars.

3. The method of claim 2 further comprising mounting one or more integrated circuits onto the first side of the substrate and under each of the first set of the plurality of electrical contact elements.

4. The method of claim 1 further comprising:
    selecting a ferromagnetic material to form the plurality of electrical contact elements; and
    selecting a ceramic material to form the substrate.

5. The method of claim 1 further comprising:
    attaching the fabricated probe card assembly to an automated test equipment system; and
    forming an electrical connection to each of a plurality of integrated circuits by fabricating the substrate on a 300 mm wafer to effect a single touchdown.

6. The method of claim 1 further comprising selecting the substrate to have a diameter of at least 300 mm.

* * * * *